(12) United States Patent
Liu et al.

(10) Patent No.: US 11,488,987 B2
(45) Date of Patent: Nov. 1, 2022

(54) DISPLAY SUBSTRATE, SPLICING SCREEN AND MANUFACTURING METHOD THEREOF

(71) Applicant: BOE Technology Group Co., Ltd., Beijing (CN)

(72) Inventors: Yingwei Liu, Beijing (CN); Shuang Liang, Beijing (CN); Zhiwei Liang, Beijing (CN); Muxin Di, Beijing (CN); Ke Wang, Beijing (CN); Zhanfeng Cao, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 154 days.

(21) Appl. No.: 16/650,690

(22) PCT Filed: Oct. 8, 2019

(86) PCT No.: PCT/CN2019/110005
§ 371 (c)(1),
(2) Date: Mar. 25, 2020

(87) PCT Pub. No.: WO2020/151257
PCT Pub. Date: Jul. 30, 2020

(65) Prior Publication Data
US 2021/0210522 A1 Jul. 8, 2021

(30) Foreign Application Priority Data

Jan. 23, 2019 (CN) .......................... 201910062179.6

(51) Int. Cl.
*H01L 27/12* (2006.01)
*H01L 25/065* (2006.01)
(Continued)

(52) U.S. Cl.
CPC ...... *H01L 27/1244* (2013.01); *H01L 25/0655* (2013.01); *H01L 25/0753* (2013.01);
(Continued)

(58) Field of Classification Search
CPC ......... H01L 27/1214–13; H01L 27/156; H01L 27/32–3297; H01L 25/0753
See application file for complete search history.

(56) References Cited

U.S. PATENT DOCUMENTS 9,508,784 B2 * 11/2016 Akimoto ............. H01L 51/5253
2002/0081503 A1   6/2002 Kawase et al.
(Continued)

FOREIGN PATENT DOCUMENTS

CN           1366205 A      8/2002
CN         101533815 A      9/2009
(Continued)

OTHER PUBLICATIONS

Office Action for corresponding Indian No. 202027022378 dated Sep. 15, 2021.
(Continued)

*Primary Examiner* — Bryan R Junge
(74) *Attorney, Agent, or Firm* — ArentFox Schiff LLP; Michael Fainberg

(57) ABSTRACT

The disclosure relates to the technical field of display devices and discloses a display substrate, a splicing screen and a manufacturing method thereof. The display substrate includes a flexible substrate; a plurality of signal lines located at one side of the flexible substrate; a plurality of plating electrodes located at one side of the signal lines toward the flexible substrate and electrically connected to the signal lines in one-to-one correspondence; a plurality of first through holes in one-to-one correspondence to the plating electrodes and penetrating the flexible substrate and
(Continued)

exposing the plating electrodes, the first through roles being filled with a conductive material inside; and a plurality of binding electrodes located at one side of the flexible substrate away from the signal lines and in one-to-one correspondence to the first through holes, the binding electrodes being electrically connected to corresponding plating electrode through conductive material in corresponding first through hole.

20 Claims, 6 Drawing Sheets

(51) Int. Cl.
H01L 25/16 (2006.01)
H01L 27/15 (2006.01)
H01L 25/075 (2006.01)

(52) U.S. Cl.
CPC .......... *H01L 25/167* (2013.01); *H01L 27/124* (2013.01); *H01L 27/1262* (2013.01); *H01L 27/156* (2013.01); *H01L 27/1218* (2013.01)

(56) References Cited

U.S. PATENT DOCUMENTS

| | | |
|---|---|---|
| 2009/0230563 A1 | 9/2009 | Yamada |
| 2014/0008816 A1 | 1/2014 | Yoda |
| 2014/0375916 A1* | 12/2014 | Chen ................. G02F 1/1345 349/33 |
| 2015/0187807 A1* | 7/2015 | Tsuruoka ............ H01L 27/124 257/347 |
| 2015/0325630 A1 | 11/2015 | Yoo et al. |
| 2015/0340419 A1 | 11/2015 | Li et al. |
| 2018/0006058 A1* | 1/2018 | Lee .................. H01L 27/1218 |
| 2018/0110122 A1* | 4/2018 | Lee ........................ H05K 3/365 |
| 2018/0138260 A1* | 5/2018 | Kajiyama .......... H01L 27/3258 |
| 2018/0197885 A1* | 7/2018 | Lee ...................... H01L 23/544 |
| 2019/0067332 A1 | 2/2019 | Liu et al. |
| 2019/0131377 A1* | 5/2019 | Kwon .................... H01L 51/56 |
| 2019/0371707 A1* | 12/2019 | Yueh ................ H01L 23/53228 |
| 2020/0020272 A1* | 1/2020 | Huang ................. H01L 27/326 |
| 2020/0091273 A1* | 3/2020 | Lee .................... H01L 27/3237 |
| 2020/0127073 A1* | 4/2020 | Ke ...................... H01L 27/1262 |

FOREIGN PATENT DOCUMENTS

| | | |
|---|---|---|
| CN | 103531553 A | 1/2014 |
| CN | 103715228 A | 4/2014 |
| CN | 107342299 A | 11/2017 |
| CN | 109585462 A | 4/2019 |
| KR | 10-2014-0005107 A | 1/2014 |

OTHER PUBLICATIONS

Office Action for corresponding Korean No. 10-2020-7029790 dated Oct. 1, 2021.

* cited by examiner

DISPLAY SUBSTRATE, SPLICING SCREEN AND MANUFACTURING METHOD THEREOF

CROSS REFERENCE TO RELATED APPLICATIONS

The application is a National stage of International Application No. PCT/CN2019/110005, filed on Oct. 8, 2019, which claims the priority of a Chinese patent application with an application number of 201910062179.6 and an application title of "Array Substrate and Manufacturing Method Thereof, Flexible Display Panel, and Splicing Screen" filed to the CNIPA on Jan. 23, 2019. All the contents disclosed herein are incorporated in full in the application by reference.

FIELD

The disclosure relates to the technical field of display devices, and in particular relates to a display substrate, a splicing screen and a manufacturing method thereof.

BACKGROUND

At present, a display substrate of a flexible display substrate includes a display area and a bezel area. As shown in FIG. 1, the bezel area is disposed with Fanout lines and binding electrodes electrically connected to gate lines 01 and data lines 02 of the display area in one-to-one correspondence, the binding electrodes being electrically connected to a flexible circuit board 03 to realize transmission of a scanning signal and a data signal.

SUMMARY

The disclosure provides a display substrate, including:
a plurality of signal lines located at one side of the flexible substrate;
a plurality of plating electrodes located at one side of the signal lines toward the flexible substrate, wherein the orthographic projection of each of the plating electrodes on the flexible substrate overlaps with a part of the orthographic projection of a corresponding signal line on the flexible substrate and the plating electrodes are electrically connected to the signal line at an overlapping position;
a plurality of first through holes, wherein the orthographic projection of the first through hole on the flexible substrate overlaps with the orthographic projection of the plating electrodes on the flexible substrate and the first through holes penetrate the flexible substrate and expose the plating electrodes, and the first through roles are filled with a conductive material inside; and a plurality of binding electrodes located at one side of the flexible substrate away from the signal lines, wherein the orthographic projection of the binding electrode on the flexible substrate overlaps with the orthographic projection of the first through hole on the flexible substrate, and the binding electrodes are electrically connected to the corresponding plating electrode through the conductive material in the corresponding first through hole respectively.

In a possible embodiment, the signal lines include a plurality of gate lines;
the plating electrodes include a plurality of gate line plating electrodes in one-to-one correspondence to the gate lines, wherein the gate line plating electrodes correspond to ends of corresponding gate lines, the plurality of gate line plating electrodes are arranged in sequence in a first direction which is parallel with a surface where the gate lines are located and perpendicular to an extension direction of the gate lines.

In a possible embodiment, the display substrate further includes a first gate insulating layer located between a layer where the gate lines are located and a layer where the gate line plating electrodes are located; and
the gate line plating electrodes are electrically connected to the gate lines by penetrating second through holes of the first gate insulating layer.

In a possible embodiment, the signal lines further include: a plurality of data lines located at one side of the gate lines away from the flexible substrate; and
the plating electrodes further include a plurality of data line plating electrodes in one-to-one correspondence to the data lines, wherein the data line plating electrodes correspond to ends of corresponding data lines, the plurality of data line plating electrodes are arranged in sequence in a second direction which is parallel with a surface where the data lines are located and perpendicular to an extension direction of the data lines.

In a possible embodiment, the gate line plating electrodes and the data line plating electrodes are located on a same layer.

In a possible embodiment, the display substrate further includes data line connecting electrodes located between a layer where the data lines are located and a layer where the data line plating electrodes are located; and
the data lines are electrically connected to the data line plating electrodes through the data line connecting electrodes.

In a possible embodiment, the data line connecting electrodes include first data line connecting electrodes, and second data line connecting electrodes located at one side of the first data line connecting electrodes toward the data lines.

In a possible embodiment, the first data line connecting electrodes and the gate lines are located on a same layer.

In a possible embodiment, a second gate insulating layer is further provided between the second data line connecting electrodes and the first data line connecting electrodes;
the second data line connecting electrodes are electrically connected to the first data line connecting electrodes by penetrating third through holes of the second gate insulating layer; and
the first data line connecting electrodes are electrically connected to the data line plating electrodes by penetrating fourth through holes of the first gate insulating layer.

In a possible embodiment, the display substrate further includes an interlayer dielectric layer located between the second data line connecting electrodes and the data lines; and the data lines are electrically connected to the second data line connecting electrodes by penetrating fifth through holes of the interlayer dielectric layer.

In a possible embodiment, the display substrate further includes a common electrode located at one side of the data lines away from the gate lines; and the plating electrodes further include one common plating electrode electrically connected to the common electrode, the common plating electrode and the gate line plating electrodes being located on a same layer.

In a possible embodiment, the display substrate further includes a first common connecting electrode located on a same layer with the data lines, a second common connecting electrode located on a same layer with the second data line connecting electrodes and a third common connecting electrode located on a same layer with the first data line connecting electrodes; and the common electrode is electrically to the common plating electrode through the first common connecting electrode, the second common connecting electrode, and the third common connecting electrode in sequence.

In a possible embodiment, the display substrate further includes a third data line connecting electrode located on a same layer with the common electrode, a flat layer is further provided between a layer where the common electrode is located and a layer where the data lines are located; and the display substrate further includes a thin film transistor, including a source electrode and a drain electrode on a same layer with the data lines, the source electrode being electrically connected to the data lines and the drain electrode being electrically connected to the third data connecting electrode by penetrating a six through hole of the flat layer.

In a possible embodiment, the display substrate further includes a plurality of boss structures located at one side of the common electrode away from the flat layer, one side of the boss structures away from the common electrode is further disposed with a plurality of binding cushion groups in one-to-one correspondence to the boss structures, and the binding cushion groups relatively include a first binding cushion and a second binding cushion which are insulated from each other;

the first binding cushion covers a part of surface of the boss structure away from the common electrode and covers a part of the third data line connecting electrode; and the second binding cushion covers a part of surface of the boss structure away from the common electrode and covers a part of the common electrode.

In a possible embodiment, the display substrate further includes a black matrix located at one side of the binding cushion groups away from the flat layer, the black matrix covering other areas other than the binding cushion groups.

In a possible embodiment, a buffer layer is formed between the flexible substrate and the plurality of plating electrodes, and the first through holes further penetrate the buffer layer.

In a possible embodiment, a material of the binding electrodes is metal or Indium Tin Oxide.

In a possible embodiment, the display substrate further includes a plurality of micro light emitting diodes, the micro light emitting diodes respectively include a first electrode and a second electrode; and the first electrode of the micro light emitting diodes is bound to the first binding cushion and the second electrode is bound to the second binding cushion.

An embodiment of the disclosure further provides a splicing screen, wherein the splicing screen includes at least two flexible display substrates provided by the embodiment of the disclosure.

An embodiment of the disclosure further provides a manufacturing method of the splicing screen provided by the embodiment of the disclosure, wherein the method includes:

providing a display motherboard having a plurality of display areas and the display mother board includes a flexible substrate having a plurality of first through holes;

forming a conductive material inside the plurality of first through holes;

cutting the display motherboard into a plurality of display substrates along an edge of each of the plurality of display areas; and jointing the plurality of display substrates.

In a possible embodiment, the providing a display motherboard having a plurality of display areas, includes:

forming a flexible substrate, a plurality of plating electrodes and a plurality of signal lines in sequence at one side of a first rigid substrate;

attaching a second rigid substrate at one side of the signal lines away from the first rigid substrate;

removing the first rigid substrate, thereby exposing the flexible substrate; and forming a first through hole at a position of the flexible substrate in one-to-one correspondence to the plating electrode through laser drilling technique;

before cutting the display motherboard into a plurality of display substrates along an edge of each of the plurality of display areas, the manufacturing method further includes: removing the second rigid substrate.

In a possible embodiment, the forming a plurality of signal lines at one side of the plating electrodes away from the flexible substrate, includes:

forming a plurality of gate lines at one side of the plating electrodes away from the flexible substrate, and simultaneously forming a first short circuit electrode extending perpendicularly to the gate lines at a gap between the adjacent display areas, the gate lines of the display areas being electrically connected to the first short circuit electrode; and forming a plurality of data lines at one side of the gate lines away from the flexible substrate, and forming a second short circuit electrode extending perpendicularly to the data lines at a gap between the adjacent display areas, the data lines of the display areas being electrically connected to the second short circuit electrode.

In a possible embodiment, the forming a conductive material inside the first through holes of the display areas, includes:

electrically connecting the first short circuit electrode and the second short circuit electrode to a plating device; and forming a conductive material inside the first through holes through the plating device.

In a possible embodiment, after forming a conductive material inside the first through holes through the plating device, the manufacturing method further includes:

forming a binding electrode at one side of the flexible substrate away from the plating electrodes and in one-to-one correspondence to the first through hole, the binding electrode being electrically connected to the corresponding plating electrode through the conductive material in the corresponding first through hole.

DETAILED DESCRIPTION OF THE EMBODIMENTS

The accompanying drawings in the embodiments of the disclosure will be incorporated below to describe the technical solutions in the embodiments of the disclosure clearly and completely. Obviously, the embodiments described are merely a part of embodiments of the disclosure rather than all the embodiments. Based on the embodiments of the disclosure, all other embodiments obtained by those skilled in the art without paying any inventive labor should fall within the protection scope of the disclosure.

Figure 1:
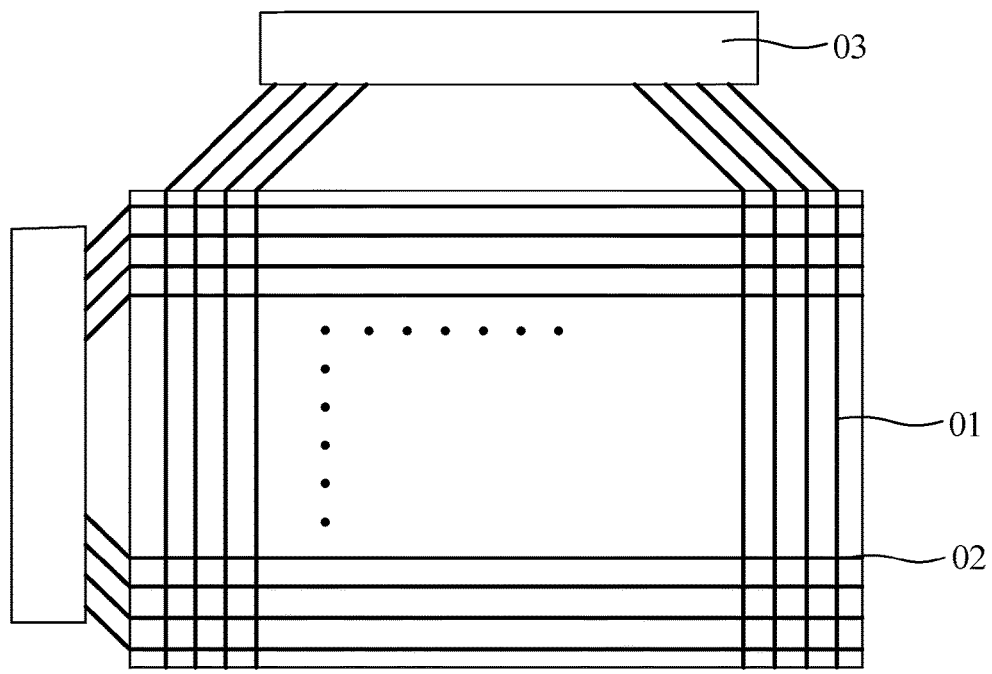
FIG. 1 is a structural diagram of a display substrate provided in the related art.
Figure 2:
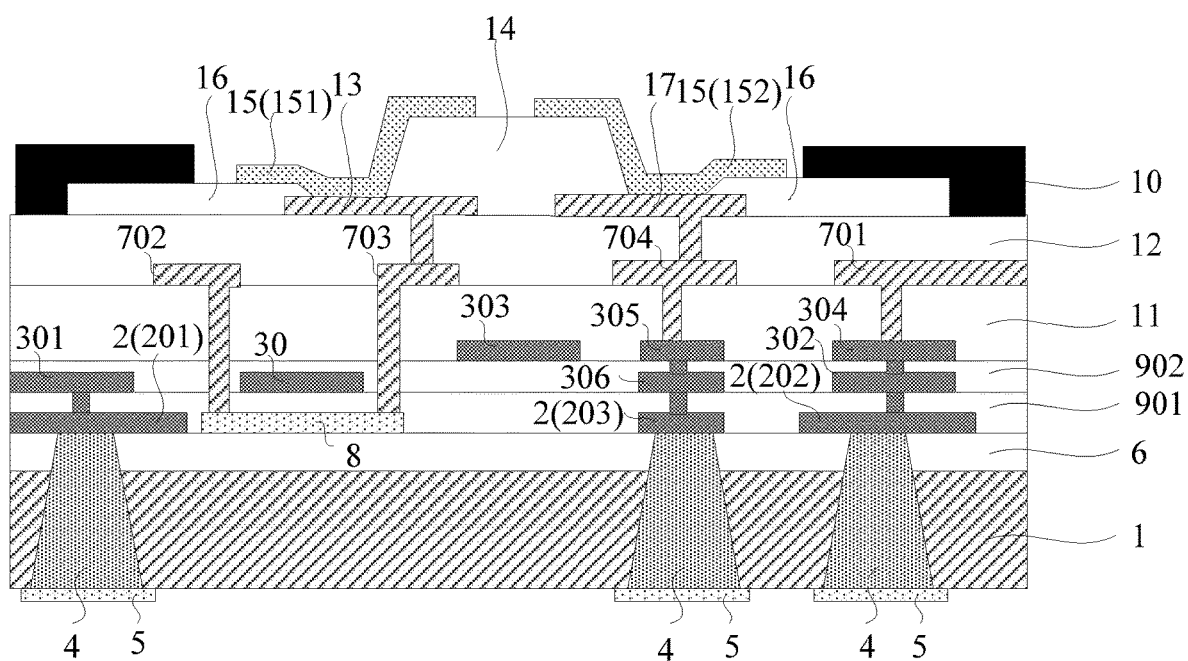
FIG. 2 is a cross-section structure diagram of a display substrate provided by an embodiment of the disclosure.

Referring to FIG. 2, the disclosure provides a display substrate, including:

a flexible substrate 1;

a plurality of signal lines (specifically the signal lines can include gate lines 301 and data lines 701) located at one side of the flexible substrate 1;

a plurality of plating electrodes 2 located at one side of the signal lines toward the flexible substrate 1 and electrically connected to the signal lines in one-to-one correspondence, wherein the orthographic projection of each of the plating electrodes 2 on the flexible substrate 1 overlaps a part of the orthographic projection of one of the signal lines on the flexible substrate 1 and the each plating electrode is electrically connected to the signal line at an overlapping position;

a plurality of first through holes in one-to-one correspondence to the plating electrodes 2, wherein the orthographic projection of the first through hole on the flexible substrate 1 overlaps the orthographic projection of the plating electrode 2 on the flexible substrate 1 and the first through holes penetrate the flexible substrate 1 and expose the plating electrodes 2, and the first through roles are filled with a conductive material inside; specifically, the area of the orthographic projection of the first through hole on the flexible substrate 1 can be greater than the area of the orthographic projection of the plating electrode 2 on the flexible substrate 1; i.e. the orthographic projection of the first through hole on the flexible substrate 1 fully covers the orthographic projection of the plating electrode 2 on the flexible substrate 1; and a plurality of binding electrodes 5 located at one side of the flexible substrate 1 away from the signal lines and in one-to-one correspondence to the first through holes, wherein the orthographic projection of the binding electrode 2 on the flexible substrate 1 overlaps the orthographic projection of the first through hole on the flexible substrate 1, and each of the binding electrodes 5 is electrically connected to the corresponding plating electrode 2 through the conductive material 4 in the corresponding first through hole; optionally, the area of orthographic projection of the binding electrode 2 on the flexible substrate 1 can be greater than the area of the orthographic projection of the first through hole on the flexible substrate 1, i.e. the orthographic projection of the binding electrode 2 on the flexible substrate 1 fully covers the orthographic projection of the first through hole on the flexible substrate 1.

In the display substrate provided by the embodiment of the disclosure, a plurality of plating electrodes 2 and signal lines for transmitting a display signal are formed on the flexible substrate 1, the signal lines are electrically connected to the plating electrodes 2, first through holes are formed at an area of the flexible substrate 1 opposite to each of the plating electrodes, the first through holes are filled with the conductive material 4 inside, binding electrodes 5 are formed at one side of the flexible substrate 1 away from the plurality of plating electrodes 2 and in one-to-one correspondence to the first through holes, and the binding electrode 5 is electrically connected to the corresponding plating electrode 2 thereof through the conductive material 4 inside the corresponding first through hole. The above structure can, by disposing the plating electrodes 2, the conductive material 4 and the binding electrodes 5, directly lead the signal lines to one side of the flexible substrate away from the signal lines to be connected to a flexible circuit board of an external circuit, thus realizing transmission of the display signal by the signal lines. Since the binding electrodes 5 are directly disposed at one side of the flexible substrate 1 away from a Thin Film Transistor (TFT) device layer and the Fanout lines on the display substrate are saved, the design of an extremely narrow bezel or a bezel free design can be realized, and manufacturing of a large-area splicing screen can be realized.

In the display substrate provided by the embodiment of the disclosure, a buffer layer 6 is further formed between the flexible substrate 1 and the plurality of plating electrodes 2, and the first through holes further penetrate the buffer layer 6; i.e. the first through holes are formed at areas of the flexible substrate 1 and the buffer layer 6 opposite to each of the plating electrodes, and the conductive material 4 is formed inside the first through holes. The buffer layer 6 can enhance the bending capability of the flexible display substrate and improve the water-oxygen-blocking capability and heat insulation effect of the display substrate.

Optionally, the material of the binding electrode 5 can be Indium Tin Oxide, which has excellent photoelectric properties. In an application, the material of the binding electrode 5 can be determined according to an actual selection and is not defined herein. Optionally, the binding electrode 5 covers the first through hole for performing the function of conducting electricity and realizing protection over the conductive material inside the first through hole.

Figure 3:
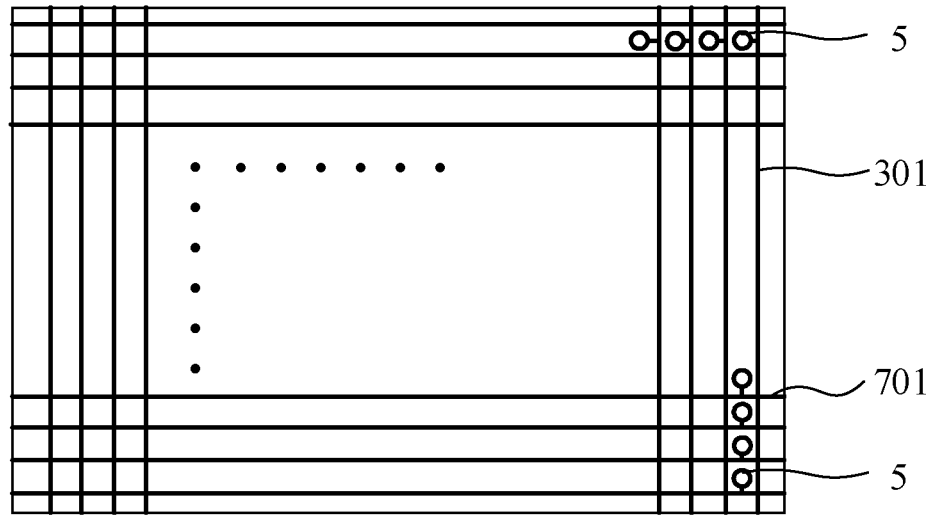
FIG. 3 is a structure diagram of a display substrate provided by an embodiment of the disclosure.

In specific implementation, referring to FIG. 2, the signal lines include a plurality of gate lines 301; the plating electrodes 2 include a plurality of gate line plating electrodes 201 in one-to-one correspondence to the gate lines 301, wherein the gate line plating electrodes 201 correspond to corresponding ends of the gate lines 301 (as illustrated in FIG. 3, the binding electrodes 5 of the gate lines 301 are arranged in a direction perpendicular to the gate lines 301, i.e. the binding electrodes 5 arranged horizontally at an upper part are binding electrodes 5 corresponding to the gate lines 301. Since the plating electrodes 2 are corresponding to the positions of the first through holes and the first through holes are corresponding to the binding electrodes 5, the positions where the binding electrodes 5 are located can also be deemed as the positions where the plating electrodes 2 are located), the plurality of gate line plating electrodes 201 are arranged in sequence in a first direction which is parallel with a surface where the gate lines 301 are located and perpendicular to an extension direction of the gate lines 301.

In specific implementation, as illustrated in FIG. 2, the display substrate further includes a first gate insulating layer 901 located between the gate lines 301 and a layer where the gate line plating electrodes 201 are located; and the gate line plating electrodes 201 are electrically connected to the gate lines 301 by penetrating second through holes of the first gate insulating layer 901.

In specific implementation, as illustrated in FIG. 2, the signal lines further include a plurality of data lines 701 located at one side of the gate lines 301 away from the flexible substrate 1; the plating electrodes 2 further include a plurality of data line plating electrodes 202 in one-to-one correspondence to the data lines 701, wherein the data line plating electrodes 202 correspond to corresponding ends of the data lines 701 (as illustrated in FIG. 3, the binding electrodes 5 of the data lines 701 are arranged in a direction perpendicular to the data lines 701, i.e. the binding electrodes 5 arranged vertically at a lower part are binding electrodes 5 corresponding to the data lines 701. Since the plating electrodes 2 are corresponding to the positions of the first through holes and the first through holes are corresponding to the binding electrodes 5, the positions where the binding electrodes 5 are located can also be deemed as positions where the plating electrodes 2 are located), the plurality of data line plating electrodes 202 are arranged in sequence in a second direction which is parallel with a surface where the data lines are located and perpendicular to an extension direction of the data lines.

In specific implementation, the gate line plating electrodes 201 and the data line plating electrodes 202 are located on a same layer. In the embodiment of the disclosure, the gate line plating electrodes 201 and the data line plating electrodes 202 are located on a same layer, so that the gate line plating electrodes 201 and the data line plating electrodes 202 can be formed together, thereby simplifying the manufacturing process.

In specific implementation, referring to FIG. 2, the display substrate further includes data line connecting electrodes located between a layer where the data lines 701 are located and a layer where the data line plating electrodes 202 are located; and the data lines 701 are electrically connected to the data line plating electrodes 202 through the data line connecting electrodes. Optionally, the data line connecting electrodes include first data line connecting electrodes 302, and second data line connecting electrodes 304 located at one side of the first data line connecting electrodes 302 toward the data lines 701.

In specific implementation, the first data line connecting electrodes 302 can be located on a same layer with the gate lines 301.

In specific implementation, a second gate insulating layer 902 can be further provided between the second data line connecting electrodes 304 and the first data line connecting electrodes 302; the second data line connecting electrode 304 is electrically connected to the first data line connecting electrode 302 by penetrating a third through hole of the second gate insulating layer 902; and the first data line connecting electrode 302 is electrically connected to the data line plating electrode 202 by penetrating a fourth through hole of the first gate insulating layer 901.

In specific implementation, referring to FIG. 2, the display substrate further includes an interlayer dielectric layer 11 located between the second data line connecting electrodes 304 and the data lines 701; and the data line 701 is electrically connected to the second data line connecting electrode 304 by penetrating a fifth through hole of the interlayer dielectric layer 11.

In specific implementation, referring to FIG. 2, the display substrate further includes a common electrode 17 located at one side of the data lines 701 away from the gate lines 201; the plating electrodes 2 further include one common plating electrode 203 electrically connected to the common electrode 17, the common plating electrode 203 and the gate line plating electrodes 201 being located on a same layer.

In specific implementation, referring to FIG. 2, the display substrate further includes a first common connecting electrode 704 located on a same layer with the data lines 701, a second common connecting electrode 305 located on a same layer with the second data line connecting electrodes 304 and a third common connecting electrode 306 located on a same layer with the first data line connecting electrodes 302; and the common electrode 17 is electrically to the common plating electrode 203 through the first common connecting electrode 704, the second common connecting electrode 305, and the third common connecting electrode 306 in sequence. Of course, in electrical connection in sequence, electrical connection can be realized in a perforating manner.

In specific implementation, referring to FIG. 2, the display substrate further includes a third data line connecting electrode 13 located on a same layer with the common electrode 17, with a flat layer 12 further provided between a layer where the common electrode 17 is located and a layer where the data lines 701 are located; the display substrate further includes a thin film transistor, including a source electrode 702 and a drain electrode 703 on a same layer with the data lines 701, the source electrode 702 being electrically connected to the data lines 701 (FIG. 2 does not show connection, but electrical connection can be performed at other positions) and the drain electrode 703 being electrically connected to the third data connecting electrode 13 by penetrating a six through hole of the flat layer 12.

In specific implementation, referring to FIG. 2, the display substrate further includes: a plurality of boss structures 14 located at one side of the common electrode 17 away from the flat layer 12, one side of the boss structures 14 away from the common electrode 17 is further disposed with a plurality of binding cushion groups 15 in one-to-one correspondence to the boss structures 14, each of the binding cushion groups 15 includes a first binding cushion 151 and a second binding cushion 152 which are insulated from each other; the first binding cushion 151 covers a part of surface of the boss structure 14 away from the common electrode 17 and covers a part of the third data line connecting electrode 13; and the second binding cushion 152 covers a part of surface of the boss structure 14 away from the common electrode 17 and covers a part of the common electrode 17.

In specific implementation, referring to FIG. 2, the display substrate further includes a black matrix 10 located at one side of the binding cushion groups 15 away from the flat layer 12, the black matrix 10 covering other areas other than the binding cushion groups 15. The projection of the black matrix 10 on the flexible substrate 1 covers the projection of the first through holes on the flexible substrate 1. The structural setting can avoid light leakage phenomenon of the display substrate.

In the above display substrate, the signal lines are electrically connected to the plating electrodes in one-to-one correspondence for realizing signal transmission.

In the above display substrate, optionally, as shown in FIG. 3, the signal lines include a plurality of mutually insulating gate lines and a plurality of data lines 701; a plurality of plating electrodes 2 include gate line plating electrodes 201 electrically connected to the gate lines 301 in one-to-one correspondence and data line plating electrodes 202 electrically connected to the data lines 701 in one-to-one correspondence; through the conductive material 4 and the binding electrodes 5, the gate lines 301 and the data lines 701 are led to one side of the flexible substrate 1 away from the plurality of plating electrodes 2, thereby making the binding electrodes 5 connected to a flexible circuit board for signal transmission.

Optionally, with a display substrate manufactured by the low temperature polysilicon technique as an example, a Thin Film Transistor (TFT) device layer can specifically include, as shown in FIG. 2, an active layer 8, a second gate insulating layer 902, a first gate metal layer, a second gate insulating layer 902, a second gate metal layer, an interlayer dielectric layer 11, a first source-drain electrode metal layer, a flat layer 12, a protection layer 16, boss structures 14 and binding cushion groups 15 for binding with a display device, wherein, the active layer 8 can be disposed on a same layer with the plating electrodes 2;

the first gate metal layer is provided with the gate lines 301 and the first data line connecting electrodes 302, the gate lines 301 being electrically connected to the gate line plating electrodes 201;

the second gate metal layer is disposed with a gate line electrode 303 forming a capacitor with the first gate metal layer and the second data line connecting electrodes 304;

the first source-drain electrode metal layer forms data lines 701 and a source electrode 702, the source electrode 702 being electrically connected to the active layer 8 and the data lines 701 being electrically connected to the data line plating electrodes 202 through the first data line connecting electrodes 302 and the second data line connecting electrodes 304, so as to avoid splicing difficulty caused by too high film layer offset;

the third data line connecting electrode 13 is electrically connected to the source electrode 702, the function of the third data line connecting electrode 13 is mainly to reduce resistance on the data lines 701 so as to reduce IR voltage drop when the display device bound to the binding cushion groups 15 displays a bigger current. Optionally, the display device can be a Micro LED display device;

the protection layer 16 functions to protect the third data line connecting electrode 13 from being damaged in a manufacturing process; and the boss structures 14 are advantageous for binding the binding cushion groups 15 with the display device.

It should be noted that the specific structure of the above display substrate only functions as a description that a narrow bezel or a bezel free design can be realized in the disclosure, rather than as a defining embodiment.

The embodiment of the disclosure further provides a flexible display substrate, wherein the flexible display substrate includes the display substrate provided by the embodiment of the disclosure.

In specific implementation, the flexible display substrate further includes a plurality of micro light emitting diodes each including a first electrode and a second electrode; and the first electrodes of the micro light emitting diodes are bound to the first binding cushions and the second electrodes are bound to the second binding cushions.

The embodiment of the disclosure further provides a splicing screen, wherein the splicing screen includes at least two flexible display substrates provided by the embodiment of the disclosure. Specifically, the plurality of flexible display substrates provided by the embodiment of the disclosure can be fixed to a same carrier through a fixing part to obtain a large-size splicing screen. The fixing part can specifically be magnet. Correspondingly, the carrier can be disposed with a magnet having the opposite polarity for absorbing the flexible display substrate to the carrier; and the fixing part can specifically be colloid as well, i.e. bonding the plurality of flexible display substrates to the carrier.

Figure 4:
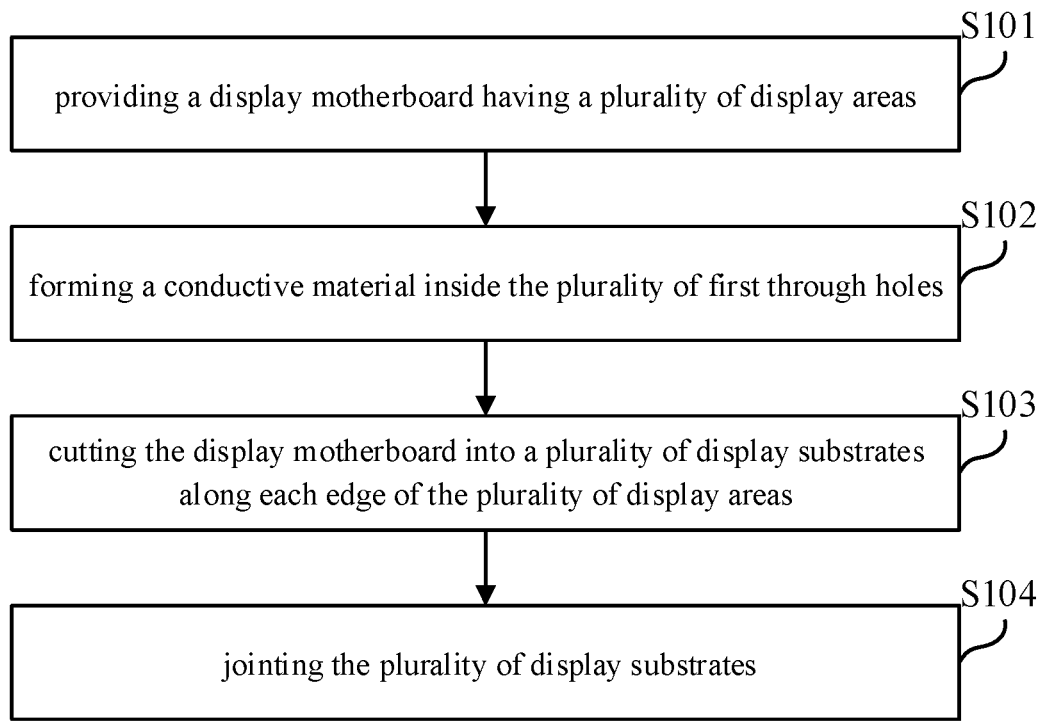
FIG. 4 is a flow chart of a manufacturing method of a splicing screen provided by an embodiment of the disclosure.
Figure 5:
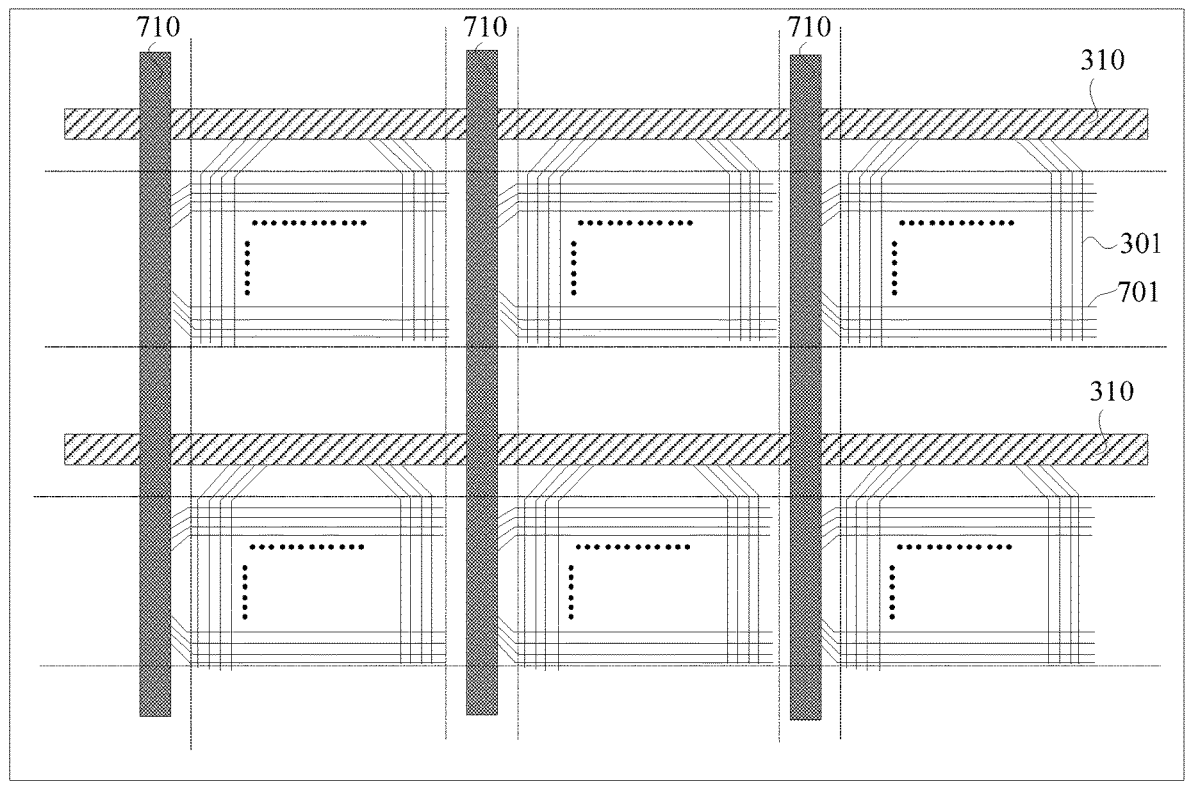
FIG. 5 is a schematic diagram of a manufacturing method of a splicing screen provided by an embodiment of the disclosure.

The embodiment of the disclosure further provides a manufacturing method of the splicing screen provided by the embodiment of the disclosure, referring to FIGS. 4 and 5, wherein the method includes:

step S101, providing a display motherboard having a plurality of display areas and including a flexible substrate having a plurality of first through holes;

step S102, forming a conductive material inside the plurality of first through holes;

step S103, cutting the display motherboard into a plurality of display substrates along an edge of each of the plurality of display areas; and step S104, jointing the plurality of display substrates together.

In specific implementation, two adjacent display areas of a same row in the display motherboard are provided with a first spacing, and two adjacent display areas of a same column are provided with a second spacing, so that an area is provided for a first short circuit electrode, a second short circuit electrode, and a gate line area and cutting. Optionally, the first spacing can be 2 millimeters to 3 millimeters, and the second spacing can be 2 millimeters to 3 millimeters. In the embodiment of the disclosure, after the display motherboard is cut, a plurality of display substrates can be formed and each of the display substrates can function as a splicing unit for subsequent splicing of a display product at any size.

In specific implementation, the step S101 in which a display motherboard having a plurality of display areas is provided, can include:

a flexible substrate, a plurality of plating electrodes and a plurality of signal lines in sequence at one side of a first rigid substrate are formed, wherein the first rigid substrate can be a first glass plate, and the signal lines can include gate lines and data lines; optionally, a flexible substrate 1, a buffer layer 6, plating electrodes 2, a first insulating layer 901, a gate layer (the gate layer can specifically include a gate 30, gate lines 301, first data line connecting electrodes 302 and a third common connecting electrode 306), a second insulating layer 902, second data line connecting electrodes 304 (simultaneously, a second common connecting electrode 305 and a gate electrode 303 can be formed), an interlayer dielectric layer 11, a source-drain electrode layer (the source-drain electrode layer can specifically include a source electrode 702, data lines 701, a drain electrode 703, and a first common connecting electrode 704), a common electrode 17 (simultaneously, a third data line connecting electrode 13 can be formed), a protection layer 16, boss structures 14, binding cushion groups 16 and a black matrix 10 can be formed in sequence at one side of the first rigid substrate;

a second rigid substrate is attached at one side of the signal lines away from the first rigid substrate, wherein the second rigid substrate can be a second glass plate;

the first rigid substrate is removed, thereby exposing the flexible substrate; and a first through hole is formed at a position of the flexible substrate in one-to-one correspondence to the plating electrode through laser drilling technique.

Before the step S103 in which the display motherboard is cut into a plurality of display substrates along an edge of each of the plurality of display areas, the manufacturing method of the embodiment of the disclosure further includes: the second rigid substrate is removed.

In specific implementation, as illustrated in FIG. 5, the step in which a plurality of signal lines are formed at one side of the plating electrodes away from the flexible substrate, includes:

a plurality of gate lines 301 are formed at one side of the plating electrodes away from the flexible substrate, and simultaneously a first short circuit electrode 310 extending perpendicularly to the gate lines 301 is formed at a gap between the adjacent display areas, the gate lines 301 of each of the display areas being electrically connected to the first short circuit electrode 310; and a plurality of gate lines 701 are formed at one side of the gate lines 301 away from the flexible substrate, and simultaneously a second short circuit electrode 710 extending perpendicularly to the data lines 701 is formed at a gap between the adjacent display areas, the data lines 701 of each display substrate being electrically connected to the second short circuit electrode 710.

In specific implementation, the step in which a conductive material is formed inside the first through holes of each of the display areas, includes:

the first short circuit electrode and the second short circuit electrode are electrically connected to a plating device; and a conductive material is formed inside the first through holes through the plating device.

In specific implementation, after a conductive material is formed inside the first through holes through the plating device, the manufacturing method further includes:

a binding electrode is formed at one side of the flexible substrate away from the plating electrodes and in one-to-one correspondence to the first through hole, the binding electrode being electrically connected to the corresponding plating electrode through the conductive material in the corresponding first through hole.

In the manufacturing method of the display substrate, a plurality of plating electrodes and a Thin Film Transistor (TFT) device layer are formed on the flexible substrate, the Thin Film Transistor (TFT) device layer including signal lines which are electrically connected to the plating electrodes; first through holes are formed at an area of the flexible substrate opposite to each of the plating electrodes, a conductive material is formed inside the first through holes through plating, finally a binding electrode is formed at one side of the flexible substrate away from the plurality of plating electrodes and in one-to-one correspondence to the first through hole, and the binding electrode is electrically connected to the corresponding plating electrode thereof through the conductive material inside the corresponding first through hole. The method can, by disposing the plating electrodes, the conductive material and the binding electrodes, directly lead the Thin Film Transistor (TFT) device layer to one side of the flexible substrate away from the Thin Film Transistor (TFT) device layer to be connected to a flexible circuit board of an external circuit, thus realizing transmission of the display signal by the Thin Film Transistor (TFT) device layer. Since the binding electrodes are directly disposed at one side of the flexible substrate away from a Thin Film Transistor (TFT) device layer and the Fanout lines on the display substrate are saved, the design of an extremely narrow bezel or a bezel free design can be realized, and manufacturing of a large-area splicing screen can be realized.

Optionally, a buffer layer is further formed between the flexible substrate and the plurality of plating electrodes; after perforating is performed on the flexible substrate, the buffer layer is etched through dry photoetching technology, thus forming a first through hole opposite to each of the plating electrodes, the first through hole penetrating the buffer layer and the flexible substrate.

Figure 6:
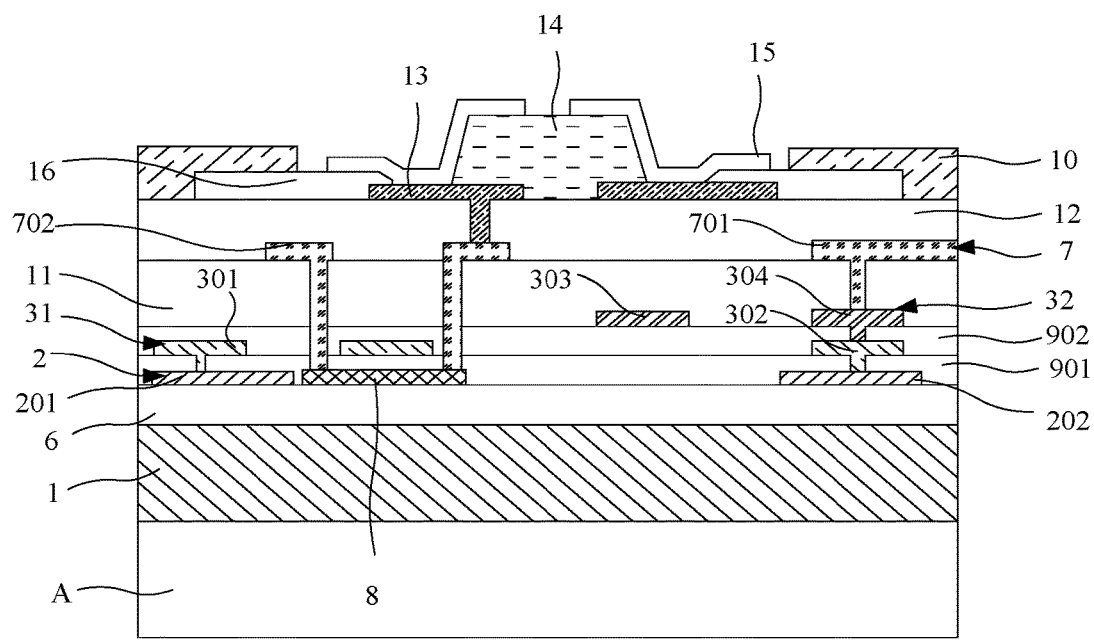
FIGS. 6-12 are state diagrams of a manufacturing process of a display substrate provided by an embodiment of the disclosure.
Figure 7:
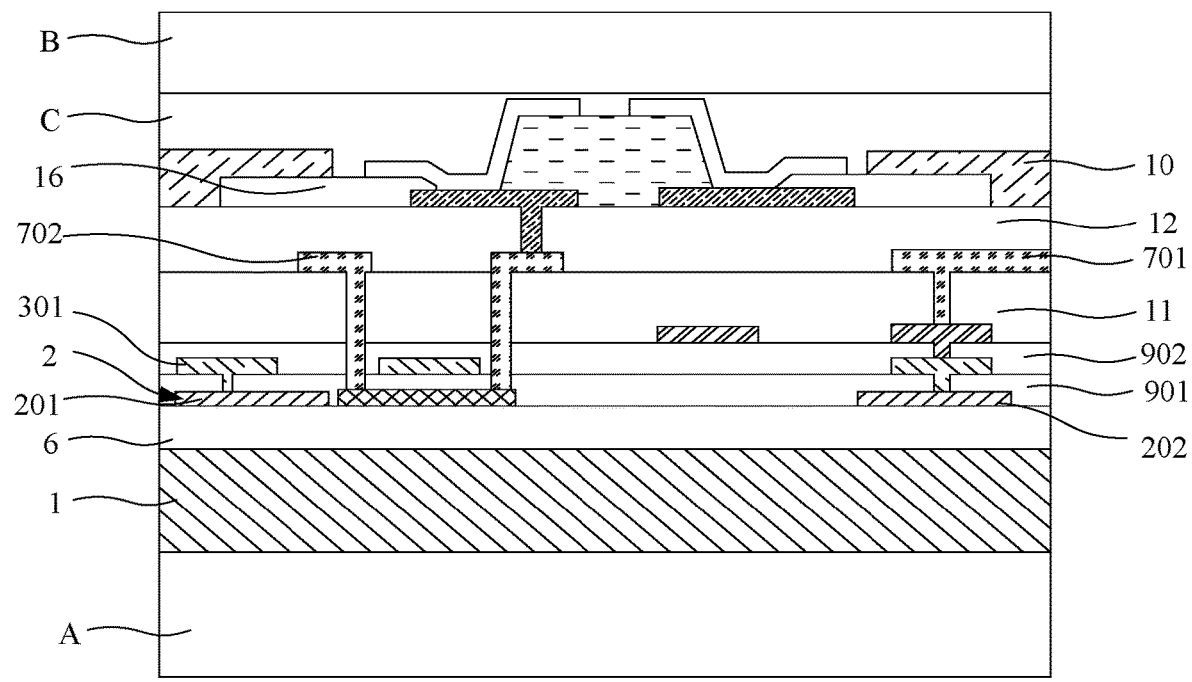
Figure 8:
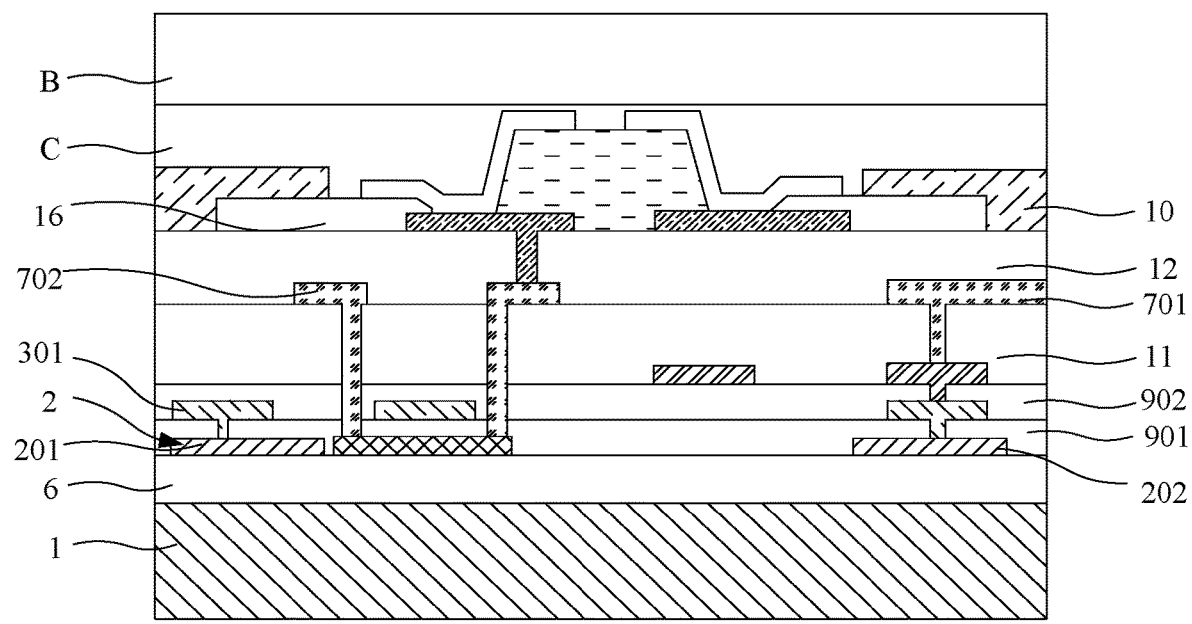
Figure 9:
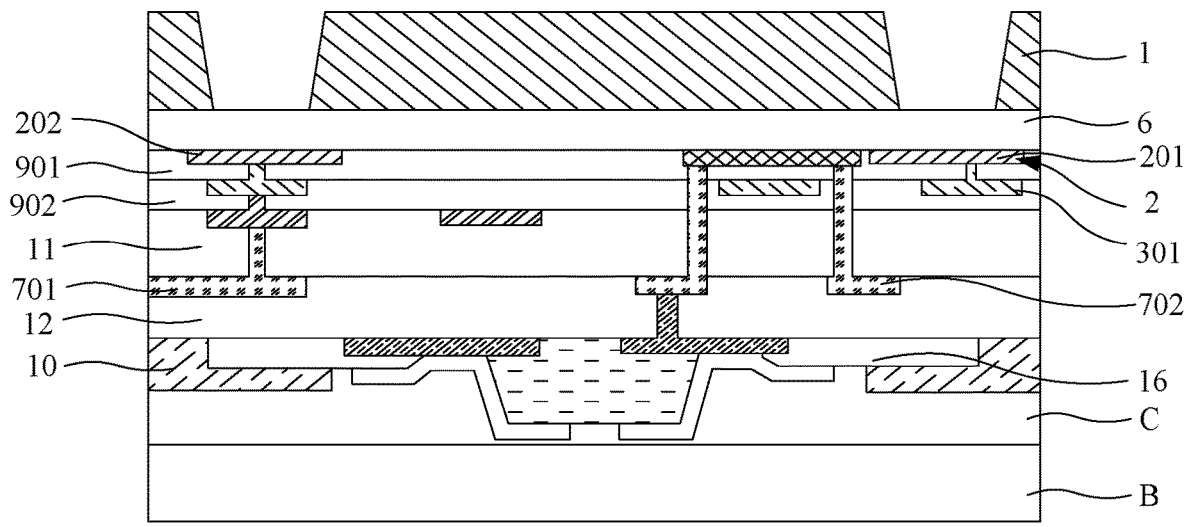
Figure 10:
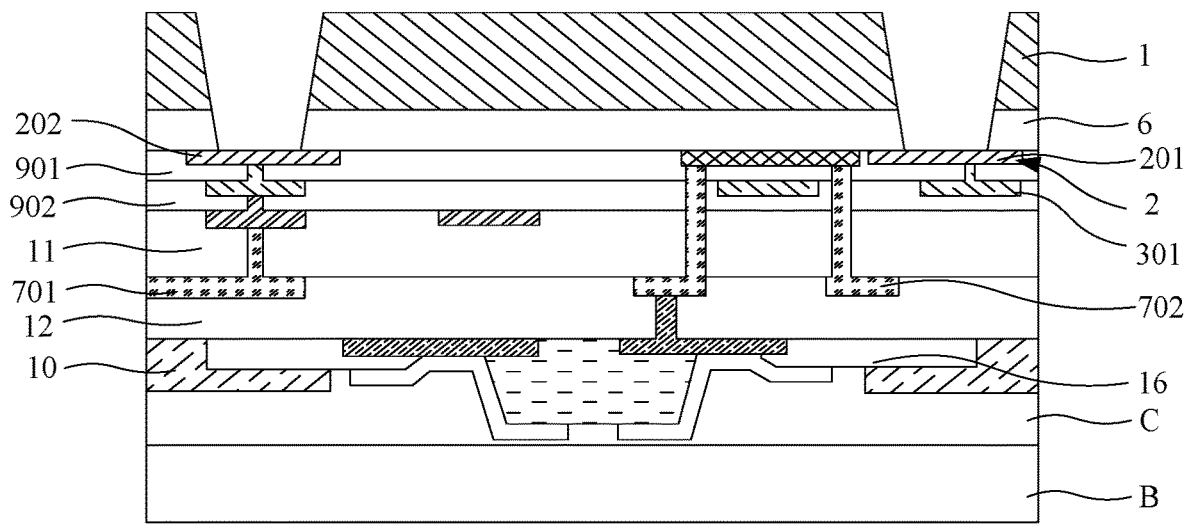
Figure 11:
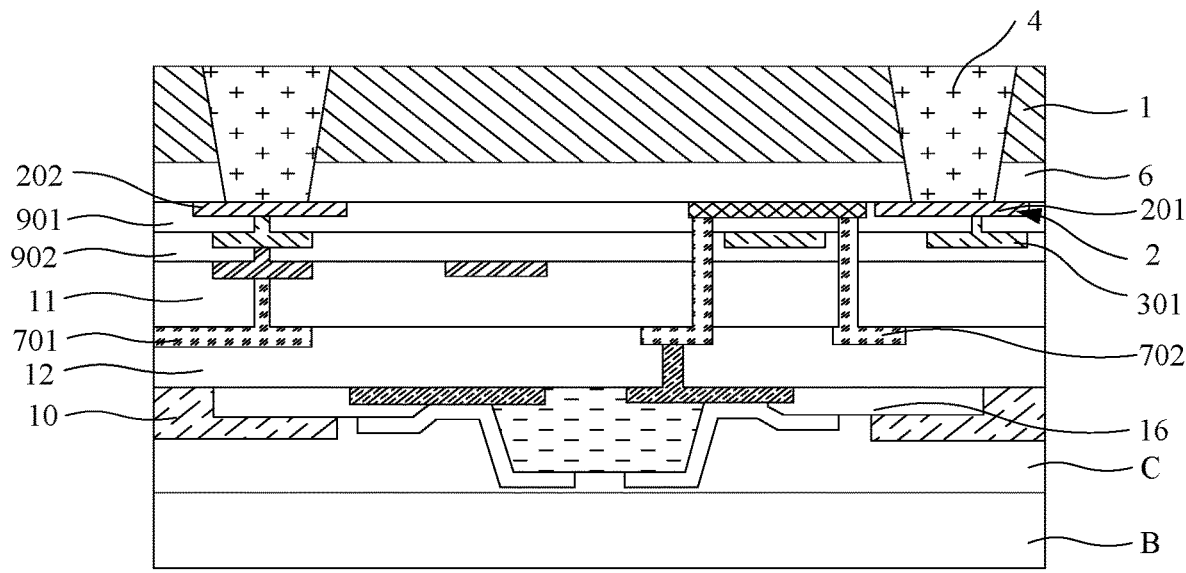
Figure 12:
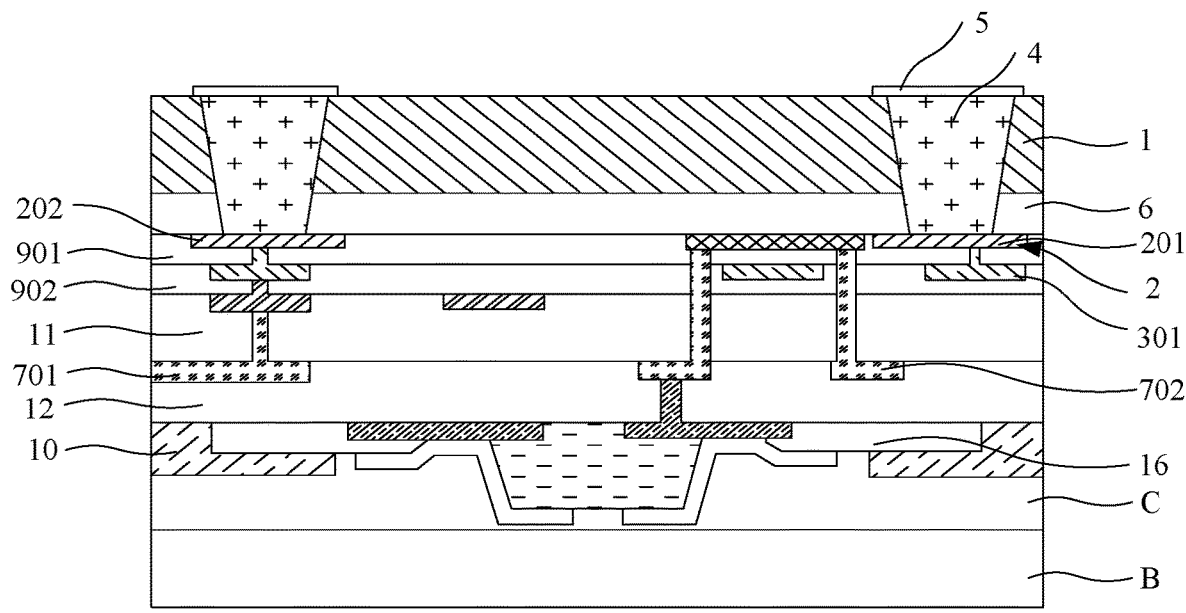

In a possible embodiment, the specific manufacturing steps of the above display substrate can include (the following description is made with a manufacturing process of one display substrate on a motherboard as an example):

step S501, a flexible substrate 1 is formed on the surface of a first glass A;

step S502, a plurality of plating electrodes 2 and a Thin Film Transistor (TFT) device layer are formed at one side of the flexible substrate 1, as shown in FIG. 6;

step S503, a second glass B is disposed at one side of the Thin Film Transistor (TFT) device layer away from the flexible substrate and an assembling device is adopted to perform box aligning on the second glass, wherein the second glass B is box-aligned and fixed through an adhesive C, as shown in FIG. 7;

step S504, a peeling device is adopted to peel off the first glass A, as shown in FIG. 8;

step S505, the laser drilling technique is adopted to perform perforating at an area on the flexible substrate and opposite to the plating electrodes and the dry photoetching technology is adopted to perform etching at an area on a buffer layer and opposite to the plating electrodes 2, thereby forming first through holes penetrating the flexible substrate 1 and the buffer layer 6, as shown in FIGS. 9 and 10;

step S506, a conductive material 4 is formed inside the first through holes with a plating manner, as shown in FIG. 11;

step S507, binding electrodes 5 are formed at one side of the flexible substrate 1 away from the plurality of plating electrodes 2, the binding electrodes 5 being electrically connected to the plating electrodes through the conductive material 4 inside the first through holes, as shown in FIG. 12; and step S508, the second glass B and the adhesive C are removed and redundant areas of the display substrate are cut off, as shown in FIGS. 2 and 3.

In the manufacturing method of the display substrate, manufacturing a Thin Film Transistor (TFT) device layer includes manufacturing signal lines electrically connected to plating electrodes in one-to-one correspondence, wherein the signal lines can include gate lines and data lines.

In a specific manufacturing method, manufacturing a Thin Film Transistor (TFT) device layer can include manufacturing an active layer 8, a first gate insulating layer 901, a first gate metal layer 31, a second gate insulating layer 902, a second gate metal layer 32, an interlayer dielectric layer 11, a first source-drain electrode metal layer 7, a flat layer 12, a third data line connecting electrode 13, a protection layer 16, boss structures 14 and binding cushion groups 15 formed in sequence at one side of a substrate 1 shown in FIG. 6;

wherein in the Thin Film Transistor (TFT) device layer, the active layer 8 can be disposed on a same layer with the plating electrodes 2; when the active layer is disposed on a same layer with the plating electrodes, a plurality of plating electrodes 2 can be manufactured firstly in a manufacturing process of the display substrate and then the active layer 8 is manufactured on a same layer; or the active layer 8 in the Thin Film Transistor (TFT) device layer can be manufactured firstly and then the plurality of the plating electrodes 2 are manufactured on a same layer;

the first gate metal layer 31 is disposed with gate lines 301 and first data line connecting electrodes 302, the gate lines 301 being electrically connected to gate line plating electrodes 201;

the second gate metal layer 32 is disposed with a gate line electrode 303 forming a capacitor with the first gate metal layer 31 and second data line connecting electrodes 304;

the first source-drain electrode metal layer 7 forms data lines 701 and a source electrode 702, the source electrode 702 being electrically connected to the active layer 8 and the data lines 701 being electrically connected to the data line plating electrodes 202 through the first data line connecting electrodes 302 and the second data line connecting electrodes 304; and the third data line connecting electrode 13 is electrically connected to the source electrode 702.

It should be noted that in manufacturing of a display substrate, if first through holes are firstly manufactured on a flexible substrate, then signal lines (gate lines and data lines, etc.) are directly lap-jointed into the first through holes in a process of manufacturing a Thin Film Transistor (TFT) device layer, it is likely to cause circuit break of signal lines due to different expansion coefficients of the flexible substrate and metal material. In the manufacturing method of the embodiment, before manufacturing a Thin Film Transistor (TFT) device layer, plating electrodes corresponding to and electrically connected to the signal lines are firstly manufactured on a flexible substrate through a plating manner. After the process of the Thin Film Transistor (TFT) device layer is ended, first through holes are manufactured and a conductive material is formed inside the first through holes through the plating process, thereby ensuring transmission of the signal on the Thin Film Transistor (TFT) device layer to one side of the flexible substrate away from the Thin Film Transistor (TFT) device layer and avoiding circuit break of signal lines. What is more, the plating electrodes are connected to the conductive material formed by plating to make signal transmission more accurate.

Optionally, the plating material 4 inside the first through holes can be copper and other conductive metal and the material of the flexible substrate can be polyimide and the like.

Obviously, those skilled in the art can make various modifications and variations to the embodiments of the disclosure without departing from the spirit and scope of the disclosure. In this way, if these modifications and variations to the disclosure belong to the claims of the disclosure and equivalent techniques thereof, the disclosure also intends to include these modifications and variations.

The invention claimed is:

1. A display substrate, comprising:
a flexible substrate;
a plurality of signal lines located at one side of the flexible substrate, wherein the signal lines comprise a plurality of data lines;
a plurality of plating electrodes located at one side of the signal lines toward the flexible substrate, wherein the plating electrodes comprise a plurality of data line plating electrodes in one-to-one correspondence to the data lines, and an orthographic projection of each of the plating electrodes on the flexible substrate overlaps with a part of orthographic projection of a corresponding signal line on the flexible substrate and the plating electrodes are electrically connected to the corresponding signal line at an overlapping position respectively;
a plurality of first through holes, wherein an orthographic projection of the first through holes on the flexible substrate overlaps with the orthographic projection of the plating electrodes on the flexible substrate and the first through holes penetrate the flexible substrate and expose the plating electrodes, and the first through roles are filled with a conductive material inside;
a plurality of binding electrodes located at one side of the flexible substrate away from the signal lines, wherein an orthographic projection of the binding electrodes on the flexible substrate overlaps with the orthographic projection of the first through hole on the flexible substrate, and the binding electrodes are electrically connected to a corresponding plating electrode through a conductive material in a corresponding first through hole respectively;

first data line connecting electrodes located between a layer where the data lines are located and a layer where the data line plating electrodes are located; and
second data line connecting electrodes located at one side of the first data line connecting electrodes toward the data lines;
wherein the data lines are electrically connected to the data line plating electrodes through the first data line connecting electrodes and the second data line connecting electrodes, and the signal lines, the plating electrodes, the first through holes, and the binding electrodes are all arranged in a display area of the display substrate.

2. The display substrate of claim 1, wherein the signal lines further comprise a plurality of gate lines located at one side of the data lines facing the flexible substrate; and
the plating electrodes further comprise a plurality of gate line plating electrodes in one-to-one correspondence to the gate lines, wherein the gate line plating electrodes correspond to ends of corresponding gate lines, the plurality of gate line plating electrodes are arranged in sequence in a first direction which is parallel with a surface where the gate lines are located and perpendicular to an extension direction of the gate lines.

3. The display substrate of claim 2, wherein the gate line plating electrodes and the data line plating electrodes are located on a same layer.

4. The display substrate of claim 2, wherein the first data line connecting electrodes and the gate lines are located on a same layer.

5. The display substrate of claim 2, further comprising:
a first gate insulating layer located between a layer where the gate lines are located and a layer where the gate line plating electrodes are located;
wherein the gate line plating electrodes are electrically connected to the gate lines by penetrating second through holes of the first gate insulating layer.

6. The display substrate of claim 1,
wherein the data line plating electrodes correspond to ends of corresponding data lines, the plurality of data line plating electrodes are arranged in sequence in a second direction which is parallel with a surface where the data lines are located and perpendicular to an extension direction of the data lines.

7. The display substrate of claim 1, wherein a second gate insulating layer is further provided between the second data line connecting electrodes and the first data line connecting electrodes;
the second data line connecting electrodes are electrically connected to the first data line connecting electrodes by penetrating third through holes of the second gate insulating layer; and
the first data line connecting electrodes are electrically connected to the data line plating electrodes by penetrating fourth through holes of the first gate insulating layer.

8. The display substrate of claim 1, further comprising an interlayer dielectric layer located between the second data line connecting electrodes and the data lines; and
the data lines are electrically connected to the second data line connecting electrodes by penetrating fifth through holes of the interlayer dielectric layer.

9. The display substrate of claim 2, further comprising a common electrode located at one side of the data lines away from the gate lines; and
the plating electrodes further comprise one common plating electrode electrically connected to the common electrode, the common plating electrode and the gate line plating electrodes being located on a same layer.

10. The display substrate of claim 9, further comprising a first common connecting electrode located on a same layer with the data lines, a second common connecting electrode located on a same layer with the second data line connecting electrodes and a third common connecting electrode located on a same layer with the first data line connecting electrodes; and the common electrode is electrically to the common plating electrode through the first common connecting electrode, the second common connecting electrode, and the third common connecting electrode in sequence.

11. The display substrate of claim 9, further comprising a third data line connecting electrode located on a same layer with the common electrode, a flat layer is further provided between a layer where the common electrode is located and a layer where the data lines are located; and the display substrate further comprises a thin film transistor, comprising a source electrode and a drain electrode on a same layer with the data lines, the source electrode being electrically connected to the data lines and the drain electrode being electrically connected to the third data connecting electrode by penetrating a six through hole of the flat layer.

12. The display substrate of claim 11, further comprising a plurality of boss structures located at one side of the common electrode away from the flat layer, one side of the boss structures away from the common electrode is further disposed with a plurality of binding cushion groups in one-to-one correspondence to the boss structures, and the binding cushion groups respectively comprise a first binding cushion and a second binding cushion which are insulated from each other;

the first binding cushion covers a part of surface of the boss structure away from the common electrode and covers a part of the third data line connecting electrode; and the second binding cushion covers a part of surface of the boss structure away from the common electrode and covers a part of the common electrode;

wherein the display substrate further comprises a black matrix located at one side of the binding cushion groups away from the flat layer, the black matrix covering other areas other than the binding cushion groups.

13. The display substrate of claim 12, further comprising a plurality of micro light emitting diodes, the micro light emitting diodes respectively comprise a first electrode and a second electrode; and the first electrode of the micro light emitting diode is bound to the first binding cushion and the second electrode is bound to the second binding cushion.

14. The display substrate of claim 1, wherein a buffer layer is formed between the flexible substrate and the plurality of plating electrodes, and the first through holes further penetrate the buffer layer.

15. A splicing screen, comprising at least two display substrates of claim 1.

16. A manufacturing method of the splicing screen of claim 15, wherein the method comprises:

providing a display motherboard having a plurality of display areas, and the display motherboard comprises a flexible substrate having a plurality of first through holes;

forming a conductive material inside the plurality of first through holes;

cutting the display motherboard into a plurality of display substrates along an edge of each of the plurality of display areas; and jointing the plurality of display substrates.

17. The manufacturing method of claim 16, wherein, the providing a display motherboard having a plurality of display areas, comprises:

forming a flexible substrate, a plurality of plating electrodes and a plurality of signal lines in sequence at one side of a first rigid substrate;

attaching a second rigid substrate at one side of the signal lines away from the first rigid substrate;

removing the first rigid substrate, thereby exposing the flexible substrate; and forming a first through hole at a position of the flexible substrate in one-to-one correspondence to the plating electrode through a laser drilling technique;

before the cutting the display motherboard into a plurality of display substrates along an edge of each of the plurality of display areas, the manufacturing method further comprises: removing the second rigid substrate.

18. The manufacturing method of claim 17, wherein the forming a plurality of signal lines at one side of the plating electrodes away from the flexible substrate, comprises:

forming a plurality of gate lines at one side of the plating electrodes away from the flexible substrate, and forming a first short circuit electrode extending perpendicularly to the gate lines at a gap between adjacent display areas, the gate lines of the display areas being electrically connected to the first short circuit electrode; and forming a plurality of data lines at one side of the gate lines away from the flexible substrate, and forming a second short circuit electrode extending perpendicularly to the data lines at a gap between the adjacent display areas, the data lines of the display areas being electrically connected to the second short circuit electrode.

19. The manufacturing method of claim 18, wherein the forming a conductive material inside the first through holes of the display areas, comprises:

electrically connecting the first short circuit electrode and the second short circuit electrode to a plating device; and forming a conductive material inside the first through holes through the plating device.

20. The manufacturing method of claim 19, wherein after the forming a conductive material inside the first through holes through the plating device, the manufacturing method further comprises:

forming a binding electrode at one side of the flexible substrate away from the plating electrode and in one-to-one correspondence to the first through hole, the binding electrode being electrically connected to corresponding plating electrode through the conductive material in a corresponding first through hole.

* * * * *